(12) United States Patent
Koppetz et al.

(10) Patent No.: US 9,473,682 B2
(45) Date of Patent: Oct. 18, 2016

(54) ELECTRONIC MOVIE CAMERA

(71) Applicant: Arnold & Richter Cine Technik GmbH & Co. Betriebs KG, Munich (DE)

(72) Inventors: Michael Koppetz, München (DE); Timo Sperber, Munich (DE)

(73) Assignee: Arnold & Richter Cine Technik GmbH & Co. Betriebs KG, Munich (DE)

( * ) Notice: Subject to any disclaimer, the term of this patent is extended or adjusted under 35 U.S.C. 154(b) by 36 days.

(21) Appl. No.: 14/473,092

(22) Filed: Aug. 29, 2014

(65) Prior Publication Data
US 2015/0070574 A1    Mar. 12, 2015

(30) Foreign Application Priority Data

Sep. 10, 2013  (DE) .................. 10 2013 218 095

(51) Int. Cl.
*H04N 5/225* (2006.01)
*G03B 17/02* (2006.01)
(Continued)

(52) U.S. Cl.
CPC .................. *H04N 5/2252* (2013.01)

(58) Field of Classification Search
CPC .... H04N 5/2252; G03B 17/02; G03B 17/55; G08B 13/196; G08B 13/19665; H05K 7/20; H05K 7/2039; H05K 7/20154
USPC ...... 348/81, 82, 373–376, 143, 244; 396/97, 396/231, 571, 575, FOR. 728, 225, 572; 374/1, 163, 183, 100
See application file for complete search history.

(56) References Cited

U.S. PATENT DOCUMENTS 5,332,031 A    7/1994  Kiga
5,394,208 A  * 2/1995  Campbell .............. G03B 29/00
                                                                348/E5.026
(Continued)

FOREIGN PATENT DOCUMENTS

CA    2850992 A1    4/2013
DE    693 11 615 T2    12/1997
(Continued)

OTHER PUBLICATIONS

Search Report dated Feb. 26, 2014 regarding DE 10 2013 218 095.0.

*Primary Examiner* — Dennis Hogue
*Assistant Examiner* — Marly Camargo
(74) *Attorney, Agent, or Firm* — Dinsmore & Shohl LLP; Douglas W. Sprinkle

(57) ABSTRACT

An electronic video camera has a camera body which comprises an inner carrier structure and at least one outer cover element which is arranged at the carrier structure and which bounds an interior space of the camera body. In this respect, the camera structure forms a central cooling passage which divides the interior space of the camera body into a ventilation space within the cooling passage and into at least one component space outside the cooling passage. The ventilation space is open toward the environment of the video camera. The component space is sealingly closed with respect to the ventilation space and the environment of the video camera. The video camera has electronic components which are received in the component space and are thermally conductively coupled to the ventilation space via at least one side wall of the cooling passage. The cover element furthermore forms a side cover which is releasable to expose the electronic components arranged in the component space for servicing purposes.

24 Claims, 3 Drawing Sheets

(51) Int. Cl.
*G03B 17/55* (2006.01)
*H05K 7/20* (2006.01)

(56) References Cited

U.S. PATENT DOCUMENTS

| | | | |
|---|---|---|---|
| 7,706,684 B2 | 4/2010 | Suzuki | |
| 2008/0089678 A1 | 4/2008 | Suzuki | |
| 2009/0003811 A1* | 1/2009 | Berend | H04N 5/2252 396/27 |
| 2009/0237537 A1* | 9/2009 | Maruyama | G03B 17/55 348/294 |
| 2009/0244363 A1 | 10/2009 | Sugimura et al. | |
| 2014/0192188 A1* | 7/2014 | McEwan | H04N 5/2252 348/143 |

FOREIGN PATENT DOCUMENTS

| | | |
|---|---|---|
| DE | 102011084200 A1 | 4/2013 |
| JP | 09139593 | 5/1997 |
| JP | 2003-230030 A | 8/2003 |
| JP | 2004-048517 A | 2/2004 |
| JP | 2006-085002 A | 3/2006 |
| JP | 2007-208614 A | 8/2007 |
| JP | 2008306303 A | 12/2008 |
| JP | 2011-041206 A | 2/2011 |

* cited by examiner

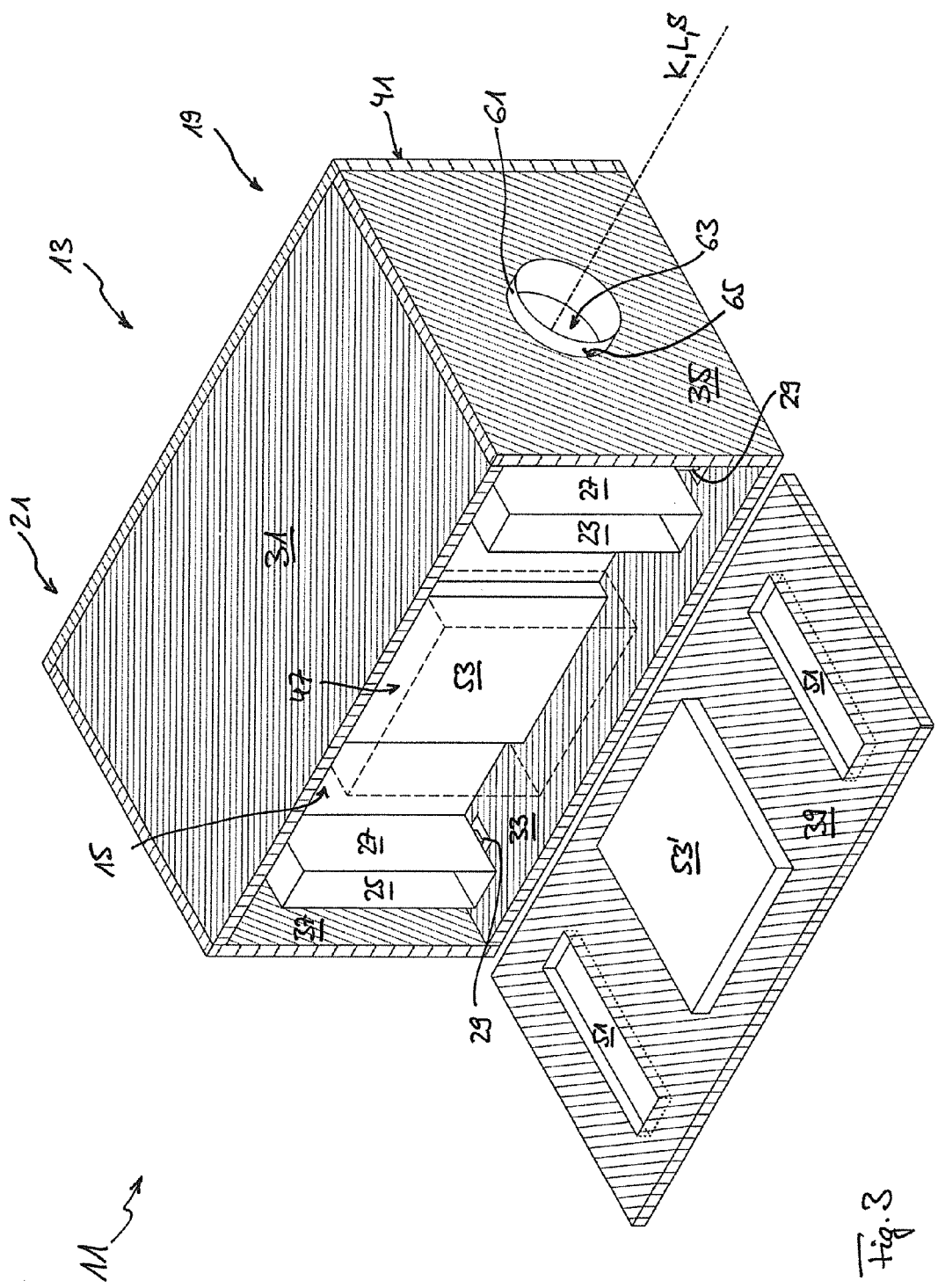

ELECTRONIC MOVIE CAMERA

CROSS-REFERENCE TO RELATED APPLICATIONS

This application claims priority of German Patent Application DE102013218095.0 filed on Sep. 10, 2013.

FIELD OF THE INVENTION

The present invention relates to an electronic video camera (also referred to as an electronic movie camera) having a camera body which comprises an interior space which is bounded by at least one outer cover element.

BACKGROUND OF THE INVENTION

The electronic video camera can have a plurality of different components for its operation. These components include, for example, an image sensor, electronic components for reading out the image sensor as well as electronic components for calibrating, processing, compressing and/or storing the image data obtained by means of the image sensor. So that such components are protected with respect to the environment of the video camera (environmental air, moisture and/or dust particles), the components are advantageously arranged in the interior space of the camera body which is delimited with respect to the environment by one or more outer cover elements.

In this respect, the camera body typically does not only serve as a protective container for the named components, but also as a stable core of the video camera which can withstand mechanical strains and can be installed in a camera system. In this respect, the camera body can also serve as a reference body for the connection of different accessory devices for the video camera. For example connections can be provided at the camera body for the support of the video camera such as connections for a tripod, a carrying handle or for fastening the camera in a camera carrying system (rig). Provision can furthermore be made that other accessory devices, for example an electronic viewfinder, a monitor display, a focus pulling device, a matte box or the like, are connected, directly or indirectly, to the camera body, for instance via adapter elements and/or carrier rods of an accessory system. Furthermore, the camera body can have an objective connection for different interchangeable objectives.

Since such accessory devices, for example a particularly long objective, can sometimes have a substantial weight, it is important that the camera body of the video camera is particularly stable. In particular when the video camera represents the central element of a comprehensive camera system, the stability of the camera body must be sufficient to allow a precise and stable arrangement of different accessory devices at the video camera, with as little mechanical clearance as possible occurring. At the same time, electronic components in the interior space of the camera body of the video camera should be protected as much as possible to the outside. In this respect, it is, however, desirable if there is the possibility of access to the respective electronic components in a simple manner, for instance in the event of servicing.

Furthermore, electronic components, in particular those which consume a lot of electrical power for complex calculations, generate heat which can result in a heating of the camera body. Such a heating of the camera body can be unpleasant for a cameraman in the vicinity of the camera, in particular when he is in direct contact with the camera, and can moreover impair the operation of the camera. The sensitivity or characteristics of the image sensor can depend on its temperature, for example. In the event of an overheating of the camera, damage to individual electronic components or to the total video camera can moreover also occur. It is therefore advantageous to provide a cooling for the camera by which the heat emanating from heat-generating components of the video camera can be led off and by which the heat development of the video camera can thus be controlled.

SUMMARY OF THE INVENTION

It is an object of the invention to provide an electronic video camera which has a particularly rugged and stable design, a reliable heat dissipation and a simple access possibility to electronic components in the interior space of the camera body.

The object is satisfied by an electronic video camera having the features of claim 1 and in particular in that the camera body of the video camera comprises an inner carrier structure and at least one outer cover element which is arranged at the carrier structure and which bounds an interior space of the camera body, wherein the carrier structure forms a central cooling passage which extends at least sectionally along a passage axis and divides the interior space of the camera body into a ventilation space within the cooling passage and into at least one component space outside the cooling passage, wherein the ventilation space is open toward the environment of the camera and the component space is sealingly closed with respect to the ventilation space and the environment of the camera. In this respect, the camera has electronic components which are received in the component space and which are thermally conductively coupled to the ventilation space via at least one side wall of the cooling passage. In addition, the at least one cover elements forms a side cover of the camera body which is releasable to expose the electronic components arranged in the component space for servicing purposes (inspection, repair or replacement of electronic components).

The carrier structure in particular forms a kind of skeleton for the camera body to take up mechanical strains of the camera body. The carrier structure, however, also has a heat-dissipating function in addition to such a stabilizing function. The carrier structure namely simultaneously forms a central cooling passage of the camera body, i.e. a cooling passage which extends in the interior space of the camera body. Heat, which is in particular generated by respective electronic components, can be conveyed away from the electronic components and out of the interior space of the camera body by the cooling passage. For this purpose, the carrier structure advantageously divides the interior space of the camera body into the named ventilation space and into the remaining interior space which comprises at least one component space with electronic components received therein. The remaining interior space can, however, also comprise a plurality of component spaces with respective electronic components received therein and/or further spaces with other functions. Depending on the respective electrical power and on the corresponding heat generation, all electronic components of the camera do not have to be arranged in a respective component space. In principle, the camera body can also have a plurality of carrying structures which form a plurality of cooling passages having respective ventilation spaces therein.

The division of the interior space of the camera body in this respect takes place such that a respective component space is sealingly closed with respect to the ventilation space. The component space is preferably moreover also sealingly closed with respect to the environment of the camera so that impurities which could endanger the operability of the electronic components arranged in the component space cannot penetrate into the component space either from the ventilation space or from the environment. The respective sealing can in particular be airtight (i.e. hermetic) or substantially airtight (i.e. with the possibility of a certain pressure compensation). Above all a leak tightness with respect to impurities, in particular with respect to dirt particles (dust, etc.) is important, however.

Unlike the component space or the component spaces, the ventilation space is in fluid communication with the environment of the camera so that heat can be led off from the ventilation space into the environment by convective cooling. A fluid is generally to be understood as a gas or a liquid. Air can in particular move out of the environment into the ventilation space and out of the ventilation space into the environment of the camera. Such an air movement can then advantageously contribute to dissipating heat out of the camera body.

To use this effect in a targeted manner, electronic cameras of the camera are thermally conductively coupled to at least one side wall of the cooling passage along whose inner side a fluid flow is provided. These components are in this respect located in a component space, that is not in the ventilation space delimited therefrom, into which or from which air from the environment can flow. Heat which is generated by these electronic components can then advantageously be transferred via the named thermally conductive coupling to the side wall of the cooling passage and can be transferred from the side wall to the air flowing through the cooling passage, whereby the heat can be led off to the environment of the camera. The thermally conductive coupling between the electronic components and the respective side wall of the cooling passage is therefore a conductive thermal coupling and can in this respect, for example, take place in that a respective electronic component is arranged directly at the named side wall. The respective electronic component can, however, also be thermally conductively coupled indirectly to the side wall via a thermal conduction device.

The respective electronic component is preferably arranged at the named side wall, i.e. the respective electronic component is not only thermally coupled to the named side wall, but is rather also mechanically fastened to the named side wall of the cooling passage (directly or via a carrier board, a carrier layer or a carrier film). It is particularly advantageous if at least some of the electronic components are arranged along the named side wall of the cooling passage, i.e. the available outer surface of the side wall of the cooling passage is utilized for fastening a plurality of electronic components next to one another (in particular behind one another with respect to the flow direction of the cooling fluid). The electronic components arranged next to one another are thus easily accessible for servicing. The respective electronic component is preferably arranged areally at the named side wall of the cooling passage so that a particularly good thermal coupling is possible by thermal conduction.

The cooling passage preferably extends substantially in a straight line along the named passage axis. The cooling passage, however, does not necessarily have to have an (exclusively) straight-line extent, but can also have sections which extend perpendicular to, obliquely to or in parallel with the passage axis. Branches can in this respect also occur in addition to deflections, for example for an inlet opening and/or an outlet opening. The cooling passage, however, extends at least sectionally along the cooling axis, with a central and/or predominant section of the cooling passage preferably extending along the cooling axis.

In this respect, that structure is called a "cooling passage" which surrounds the ventilation space and separates the ventilation space from the outside component space or the outside component spaces. This structure substantially corresponds to the named carrier structure. In this respect, the cooling passage can in particular be peripherally closed and can be configured as tubular or at least as tube-like. For example, in the event of a substantially round or oval cross-section of the structure, a side wall can be provided which is continuous in the peripheral direction. A plurality of side walls can, however, also be provided along the periphery, in particular four side walls, for example when the cooling passage has a rectangular cross-section.

At least one outer cover element is moreover arranged at this structure which, on the one hand, supports the camera body as a carrier structure and, on the other hand, provides a reliable heat dissipation from the camera body. A plurality of such outer cover elements are preferably provided, as will be explained in the following. This cover element or these cover elements in particular forms or form outsides of the video camera and thus delimit the camera with respect to its environment. The outer jacket of the camera body can in particular solely be formed by the named cover element(s) without the carrier structure being visible from the outside when all of the outer cover elements are installed. The outer cover element or the outer cover elements does or do not have to contribute itself or themselves to the stability of the video camera due to the presence of the inner carrier structure. Unlike a typical housing of a video camera which simultaneously represents both the stable support structure of the camera and the outer jacket of the camera by which the interior space of the camera is protected to the outside, these two functions are split in the video camera in accordance with the invention between the carrier structure, on the one hand, and between the outer cover element(s) arranged thereat, on the other hand.

It is in particular thereby made possible that a release of one of the cover elements does not impair the stability of the camera body. Such a release of one of the cover elements can be necessary, for example, in a servicing case in which access to the electronic components in a respective component space is required in order, for example, to be able to electrically contact, to repair and/or to replace one of the components. For this purpose, the respective cover element which closes the component space to the outside and thus forms a side cover of the camera body can then advantageously be released from the (remaining) camera body in a simple manner.

The release of the side cover from the camera body is in particular such that access is enabled to the electronic components arranged in the component space. This can be realized in different manners. The side cover can preferably be moved relative to the camera body into a servicing position or the side cover can be completely removed from the camera body. In this respect, the respective remaining camera body is meant, that is the camera body without this side cover. The movement of the side cover can in particular be a pivoting or a translatory movement, for example a sliding.

The fact that the side cover can be completely removed from the remaining camera body in particular means that the side cover then no longer has any contact to the remaining outer casing (e.g. further side covers) and/or to the carrier structure of the camera body. In this respect, the side cover, however, does not necessarily have to be completely decoupled from the camera body. For example, electronic components of the video camera can be arranged at the side cover which are, for instance, connected via cables to other electronic components which are located in the same component space, but are, for instance, arranged at the side wall of the cooling passage. If the side cover is completely removed from the camera body in such an embodiment in the named sense, it can furthermore be physically connected to the camera body via the cables connecting the electronic components to one another.

In accordance with a preferred embodiment, the camera body has an elongate shape along a longitudinal axis, with the passage axis coinciding with the longitudinal axis of the camera body or extending in parallel with the longitudinal axis of the camera body. The cooling passages thus extends at least sectionally substantially in the direction of the longitudinal axis through the camera body. The cooling passage can in particular in turn have an elongated shape which is aligned along the named passage axis. The cooling passage is then substantially accordingly aligned with the camera body. In this manner, with a camera body having an elongate shape, the cooling passage can extend through large parts of the camera body and can thus provide a particularly large surface for transferring heat from a respective component space into the ventilation space. In addition, in this manner, a plurality of regions, in particular all regions, of the camera body can be reliably cooled by means of a single cooling passage.

The camera body can in particular comprise an objective connection for an interchangeable objective by whose alignment a visual axis of the camera body is defined which can correspond to the named longitudinal axis of the camera body. The cooling passage thus extends substantially from the front to the rear through the camera body. Alternatively to this, the named longitudinal axis of the camera body and accordingly also the passage axis can, however, also extend perpendicular to the visual axis of the camera body, in particular in a vertical direction, so that the cooling passage extends substantially from the bottom to the top through the camera body.

Electronic components are preferably arranged at the cooling passage at at least two sides of the cooling passage aligned opposite to one another transversely to the passage axis (in particular at two mutually oppositely disposed side walls of the cooling passage). In this respect, it is in particular a left side and a right side of the cooling passage with respect to a normal operation alignment of the camera. With respect to a front side of the camera having an objective connection the sides aligned opposite to one another transversely to the passage axis can be arranged horizontally adjacent to this front side.

In accordance with a preferred embodiment, the camera body has an outer casing which comprises the named outer cover element (or the plurality of named outer cover elements), with the carrier structure forming an assembly separate from the outer casing. The carrier structure can thus in particular be produced independently of further components of the camera body of the video camera and can than serve as a basic structure for the further assembly of the camera body. An assembly is in this respect in particular to be understood as an independent, self-supporting multipart structure whose components are permanently connected to one another. In this respect, the assembly is configured as a structural unit which does not, however, necessarily have to comprise a uniform material.

It can be particularly advantageous if the assembly has a frame (e.g. in the form of a cage) of a first material and has wall elements of a second material held in the frame, with the second material having a higher thermal conductivity than the first material. The frame comprising the first material can thus be adapted to effect a high mechanical stability, while the wall elements comprising the second material provide a high thermal conductivity, for example when the wall elements form the named side walls of the cooling passage or parts hereof. The assembly can, for example, comprise a frame of a carbon fiber material, metal plates as wall elements and sealing elements of plastic. Advantageous properties of different materials can be combined by such a design. The frame of carbon fiber material is light, flexurally rigid and warp resistant. The metal wall elements which can, for example, comprise copper, have a good thermal conductivity for transferring heat from a respective component space into the ventilation space. Plastic is particularly well-suited for sealing, in particular at inlet openings and outlet openings, in corners and edges or at transitions between the named frame and the named wall elements. In this respect, the sealing elements can, for example, be sealing rings or sealing frames which are e.g. produced as injection molded parts from elastomer.

In accordance with an alternative embodiment, the carrier structure is formed in one piece. In the case of a one-part type of construction, the components of the carrier structure of the camera body are unreleasably connected to one another and can in particular be produced from a uniform material. The carrier structure in this respect preferably comprises a metal, for example aluminum, with the carrier structure being able to comprise, for example, a tube with structural elements welded thereat.

It is furthermore preferred if the carrier structure has a plurality of prolongations for fastening the cover element or the cover elements which are preferably provided at marginal regions and/or corner regions of the cooling passage. The prolongations can in particular project as elevated portions from the carrier structure. A spacing between the remaining carrier structure and the respective cover element can advantageously be defined by these prolongations so that an intermediate space is produced between the respective cover element and the carrier structure. This intermediate space or parts of the intermediate space can then form one or more component spaces for receiving the electronic components of the camera body.

Since the named prolongations are provided at marginal regions and/or corner regions of the cooling passage and preferably also since only a few of these prolongations, in particular four, are provided for a respective cover element, the respective cover element connected to the carrier structure via the prolongations can be substantially thermally decoupled from the carrier structure. When the carrier structure as a cooling passage takes up heat from the electronic components coupled to the cooling passage, this heat is, however, not transferred, or is only transferred slightly, to the respective cover element due to the small number of prolongations, but is rather emitted at least predominantly to the ventilation space, in particular also due to the large surface of the cooling passage. The cover element respectively arranged at the prolongations is preferably substantially thermally decoupled from the carrier structure so that heat taken up by the carrier structure is substantially not transferred to the cover element. The named prolongations can for this purpose in particular be at least partly produced from a material having low thermal conduction. Alternatively or additionally, a thermal insulation can also be provided between the prolongations and the respective cover element arranged at the prolongations, for example by thermally insulating intermediate elements.

The inner carrier structure can, however, in accordance with a further embodiment, also have fastening webs along whose longitudinal extent the outer cover element(s) is/are fastened. It is also possible with such an embodiment that the fastening webs project up to the outside of the camera body and then are still also visible from the outside (e.g. as housing edges) when all of the outer cover elements are installed.

It is generally possible that the camera body has a single outer cover element arranged at the carrier structure. Said outer cover element can in particular have an angled and/or closed cross-section (e.g. L-shaped, U-shaped or O-shaped cross-section) so that one or more component spaces can be opened simultaneously at a plurality of sides of the cooling passage by releasing this cover element. For example, such a single cover element can form a peripherally closed sleeve having an O-shaped cross-section or a double-angled side wall having a U-shaped cross-section.

In accordance with a preferred embodiment, the camera body, however, as already mentioned, comprises a plurality of outer cover elements which are arranged at the carrier structure and which together surround the interior space of the camera body. The outer casing of the camera body hereby has a modular design so that selectively only individual ones of the plurality of cover elements are released to expose the electronic components arranged in a respective component space for servicing purposes. In this embodiment, one or some or all of the plurality of outer cover elements can form a respective side cover which—as explained—can be released from the remaining camera body in order selectively to expose electronic components.

In such an embodiment having a plurality of outer cover elements, the cover elements of the camera body can form a first group and a second group, with only the cover elements of the first group being directly fastened to the carrier structure and with the cover elements of the second group being indirectly fastened to the carrier structure via the cover elements of the first group. In this manner, there is a kind of hierarchy between the cover elements, in accordance with which the cover elements are fastened to the carrier structure. One or more cover plates which form the first group are directly connected to the carrier structure, in particular to the named prolongations of the carrier structure. These cover elements of the first group can in particular be permanently fastened to the carrier structure, i.e. they are no longer removed from the carrier structure even for servicing purposes. One or more further cover elements of the second group can then be fastened to these cover elements of the first group. One or more cover elements can also be provided which are connected to the carrier structure via at least one cover element of the second group (and consequently also via at least one cover element of the first group) and are thus arranged downstream of the cover elements of the first and second groups in the named hierarchy, that is form a third group in this regard. In this connection, indirectly means that a respective cover element is not directly fastened to the carrier structure, but is rather connected to the carrier structure via one or more other cover elements.

The named releasable side cover is in particular an element of the named second or, if present, third group. If the named releasable side cover is indirectly fastened to the carrier structure, preferably no further cover element is indirectly fastened to the carrier structure via this named releasable side cover. In this manner, the named side cover can be released from the remaining camera body for servicing purposes without further cover elements necessarily likewise having to be released from the camera body or having their alignment changed.

In accordance with an advantageous embodiment, the cover elements comprise at least one front cover, one rear cover, one upper cover, one lower cover, one first side cover and one second side cover. At least one of these cover elements, in particular the first or second side cover, can be the named releasable side cover. The designations of the cover elements can be understood as with respect to a visual axis of the video camera. In this respect, the front cover and the rear cover, the upper cover and the lower cover as well as the first side cover and the second side cover can each be aligned opposite to one another. For example, the first side cover and the second side cover can be arranged at a left side and at a right side of the camera body.

In particular when the camera body has no further cover elements than the named ones, the camera body can be configured as substantially parallelepiped with the named cover elements as the six side surfaces of the parallelepiped. In addition, the cover elements can be substantially areal, with them by all means being able to have structures or extensions deviating from an area. However, the edges formed by the cover elements, i.e. the transition lines between the cover elements, are preferably aligned substantially perpendicular to or in parallel with one another and thus substantially represent the frame of a parallelepiped.

The cover elements do not necessarily have to only serve the covering of the interior space of the camera body, but can rather also have functional elements which are integrated in the cover elements and/or are arranged at the cover elements. One or more cover elements can in particular have further electronic components and/or can, for example, have an image data recording device. Such functional elements can in this respect be arranged in a component space of the camera body, with them being able to be connected to the respective cover element and thus in particular being able to be connected indirectly to the carrier structure. Provided that a releasable cover element has such functional elements, these functional elements can equally be exposed by a release of the cover element as other electronic elements, in particular arranged at the cooling passage, in the component space covered by this cover element.

In a preferred further development, only the upper cover and the lower cover are indirectly fastened to the carrier structure. In this manner, some few fastening points are sufficient for arranging the covers at the carrier structure so that only little heat is advantageously transferred by the carrier structure onto the cover elements and thus onto the outer casing of the camera. The fact that the upper cover and the lower cover are actually directly fastened to the carrier structure as the only cover elements is moreover advantageous in that typically accessory devices for the video camera are connected to an upper side or to a lower side of the camera body, for example a tripod, a carrier handle or a rig for accessory devices associated with an objective connected to the camera. The direct arrangement of the upper cover and of the lower cover at the carrier structure transfers the stability of the carrier structure to these covers and allows a reliable, stable and particularly clearance-free fastening of such accessory devices at two mutually opposite sides, namely at the upper side and at the lower side of the camera body. In contrast, the remaining sides of the camera body do not necessarily have to have an equally high stability.

In accordance with a particularly advantageous embodiment, a respective mechanical interface (e.g. a respective dovetail guide) is integrated into the upper cover and/or into the lower cover for fastening an accessory device to the camera body. In other words, the respective mechanical interface is an integral component of the upper cover and/or of the lower cover without additional intermediate elements (e.g. an adapter plate) being required. A mechanical strain between the carrier structure of the camera body and a connected accessory device can thus be transferred almost directly, namely via only one single element of the outer casing of the camera body, with this being particularly important for the upper side of the camera body (e.g. connected handle as an accessory device) and for the lower side of the camera body (e.g. connected tripod).

In accordance with a further development, the front cover and the rear cover can be fastened to the upper cover and to the lower cover. In this embodiment, the front cover and the rear cover are therefore only indirectly connected to the carrier structure via the upper cover and the lower cover. Such an indirect arrangement can have a stability sufficient for the front side and for the rear side of the video camera and moreover has the advantage that heat taken up by the carrier structure cannot be directly transferred to the front cover and to the rear cover. As explained above, the upper cover and the lower cover can already be substantially thermally decoupled from the carrier structure due to the type of their fastening to the carrier structure, in particular via as few correspondingly configured fastening sections as possible such as the named prolongations. This consequently applies all the more to the front cover and to the rear cover when they are only indirectly connected to the carrier structure via the upper cover and the lower cover.

It is furthermore advantageous if the first side cover and the second side cover are fastened to the upper cover, to the lower cover, to the front cover and/or to the rear cover. The first and second side covers can in particular only be fastened to the upper cover and to the lower cover or only to the front cover and to the rear cover. The first and second side covers can, however, also each be fastened to one, two, three or all of these cover elements, with the first side cover being able to be fastened to other cover elements than to the second side cover. The first side cover and the second side cover are in particular not directly connected to the carrier structure. No respective other cover elements are preferably indirectly connected to the carrier structure via the first side cover and/or via the second side cover. In this manner, the first side cover and/or the second side cover can be releasable from the remaining camera body independently of respective other cover elements, that is without a release of the first and/or second side covers making a change in the arrangement of another cover element necessary.

In accordance with a further embodiment, some of the six aforesaid cover elements (front cover, rear cover, upper cover, lower cover, first side cover and second side cover) can be formed at least in part in common by a respective single element. For example, the upper cover and the rear cover or a part of the upper cover and the rear cover can also be formed by a single cover element.

In accordance with a further embodiment, at least one first component space and one second component space, in which component spaces electronic components are received, are formed in the interior space of the camera body, with the first component space being sealingly closed by a first side cover, in particular by the already named first side cover and with the second component space being sealingly closed by a second side cover, in particular by the already named second side cover, and with the first side cover and the second side cover being able to be moved or removed to expose the electronic components arranged in the respective component space for servicing purposes.

The interior space of the camera body is consequently not only divided into a ventilation space and into a single component space, but the remaining space of the interior space of the camera body next to the ventilation space can comprise a plurality of component spaces which are delimited from one another. In this respect, this delimitation does not necessarily have to be evenly leak tight as the delimitation between the component spaces, on the one hand, and the ventilation space as well as the environment of the camera, on the other hand. In addition, the total remaining interior space of the camera body next to the ventilation space does not have to form one or more component spaces for receiving electronic components, but further spaces can also be provided for other purposes in the interior space of the camera body, optionally also unused free spaces.

In accordance with an advantageous further development, the first component space and the second component space are arranged at two sides of the cooling passage opposite to one another transversely to the passage axis. These two sides can be a left side and a right side of the cooling passage, in particular with respect to a visual axis of the video camera.

The cooling passage (apart from passage prolongations having inlet openings and/or outlet openings) can, for example, extend substantially longitudinally centrally between a front section of the camera body and a rear section of the camera body, with the cover elements of the camera body being spaced apart from the central course of the cooling passage so that a space remains between the cover elements and the cooling passage which can be utilized as one or more component spaces. This space in particular surrounds the cooling passage in the peripheral direction with respect to the passage axis. In this respect, this space can be divided by wall elements into different part spaces, with the wall elements in particular being configured with respect to their thermal conductivity such that a heat transfer is prevented from one of the part spaces to a respective cover element and/or is amplified to the cooling passage. Two such part spaces opposite to one another transversely to the passage axis can them form component spaces of the camera body and can, for example, be arranged at a left side or at a right side of the cooling passage, that is substantially horizontally adjacent to the cooling passage and can respectively accommodate electronic components of the camera. The first and second component spaces can then be exposed for servicing purposes by the release of side covers, in particular by a side cover arranged at a left side of the camera body or by a side cover arranged at a right side of the camera body, the side covers closing the first and second component spaces respectively to the outside.

In accordance with a further advantageous embodiment, the cooling passage likewise extends between a front section of the camera body and a rear section of the camera body. The passage axis in particular connects the front section of the camera body and the rear section of the camera body. In this respect, the cooling passage preferably has at least one inlet opening in the front section and at least one outlet opening in the rear section, or vice versa. The inlet openings and the outlet openings are thus preferably arranged at opposite ends of the cooling passage, with the cooling passage in particular admittedly being able to be branched into a plurality of inlet openings and/or into a plurality of outlet openings, but otherwise having a non-branched extent, i.e. in particular without dead ends and/or loops. The inlet openings and/or outlet openings are preferably located at corresponding passage prolongations whose alignment can differ from the substantial extent of the cooling passage along the passage axis, can in particular be aligned perpendicular to the passage axis.

It is particularly preferred if the cooling passage has two lateral inlet openings in the front section and one lateral outlet opening in the rear section. For example, the named openings can be provided at a left side and/or at a right side of the cooling passage.

In an embodiment, the cooling passage has at least two inlet openings which are aligned opposite to one another transversely to the passage axis and/or the cooling passage has at least two outlet openings which are aligned opposite to one another transversely to the passage axis. For example, an inlet opening or an outlet opening is aligned to a left side of the cooling passage and the at least one further inlet opening or outlet opening is aligned to a right side of the cooling passage.

It is particularly preferred in this respect if an outlet opening is only provided on such a side of the cooling passage which typically faces away from a user of the camera or at least does not face toward him on a use of the camera. With a video camera which can, for instance, be utilized lying on the right shoulder of a cameraman, respective outlet openings preferably do not face to the left to the head of the cameraman with respect to a visual axis of the video camera, but rather in particular to the right away from the cameraman to avoid waste heat from being expelled in the direction of the cameraman. Inlet openings of the cooling passage can in contrast be provided both at a left side and at a right side or at other sides of the cooling passage or of the video camera. However, with respect to an installation or placing down of the camera on its lower side or to a carrying of the camera at its upper side, it can be advantageous not to provide inlet openings and/or outlet openings of the cooling passage which are aligned toward a lower side and/or toward an upper side of the camera body.

It is furthermore advantageous if the cover element or elements of the camera body has or have at least one or more passage openings for a fluid communication of the ventilation space with the environment of the camera in the region of at least one of the inlet openings and outlet openings of the cooling passage. Such passage openings can, for example, be ventilation slits or ventilation boreholes. The passage openings can, for example, be formed in the manner of a grid or can have an additional grid to avoid a penetration of larger elements into the ventilation space. In principle, the passage openings are, however, advantageously opened sufficiently wide that an air flow can flow through them which is suitable reliably to lead off heat arising in the camera body from the camera body. A penetration of dust or of other small parts is in this respect comparatively unproblematic to the extent that the ventilation space is sealingly closed with respect to the component spaces so that there is no contamination of or damage to the electronic components in the component spaces.

The cooling passage is preferably at least sectionally formed from thermally conductive material. The cooling passage can thereby conduct heat which is thermally conductively transferred from a respective component space onto a side wall of the cooling passage onward toward the ventilation space and can advantageously output it to air located in the ventilation space so that the heat can then be led off from the ventilation space to the environment of the camera. For example, side walls of the cooling passage can be configured at least partly as copper plates or from another metallic material.

It is furthermore advantageous if the electronic components are thermally conductively coupled directly or indirectly via a thermal conduction device to a respective side wall of the cooling passage. In this manner, heat generated by the electronic components can be conducted in a directed manner to the cooling passage and is not irradiated, or is only irradiated to a small extent, into the component space in which the electronic component is located or is not transmitted to other electronic components or elements of the camera body.

The cooling passage preferably has cooling fins at the inner side which extend into the ventilation space and which are aligned substantially in parallel with the extent of the cooling passage. The surface of the cooling passage at the ventilation space side can be increased with the aid of such cooling fins, which can result in an improved transfer of heat to air located in the cooling passage. The cooling fins are in this respect in particular aligned such that an air flow through the cooling passage is not impeded by the cooling fins, but is rather advantageously conducted along the cooling fins for a heat dissipation which is as efficient as possible.

It is furthermore advantageous if a blower is provided in the ventilation space for generating a fluid flow through the cooling passage. The blower is in particular arranged such that the fluid flow extends from the inlet opening or openings of the cooling passage through the cooling passage to the outlet opening or openings of the cooling passage. In this manner, a directed flow can be generated in the cooling passage by means of the blower so that air heated in the ventilation space can be expelled from the cooling passage and cooler air from the environment of the camera can be sucked into the cooling passage. The intensity of the fluid flow can in this respect be regulated by the blower and adapted to different situations of use. For example, with a high heat generation in the component space or spaces of the camera body, an increased heat dissipation can take place by increasing the fluid flow. In this respect, the blower can in particular be arranged at or in the cooling passage such that noises emanating from the blower are as unperceivable as possible.

In accordance with a further embodiment, the camera body furthermore has an objective connection for an interchangeable objective, with the objective connection being fastened to the carrier structure. The carrier structure can in particular have a plurality of fastening devices for fastening the objective connection to the carrier structure. The objective connection becomes particularly stable and is reliably connected to the different components of the camera body by the fastening of the objective connection at the carrier structure. This is in particular important when a particularly long and/or heavy objective, by which high forces and bending torques can act on the objective connection, is to be connectable to the objective connection. The forces and bending torques can be transferred to and taken up by the stable carrier structure due to the named fastening devices. In this respect the forces and bending torques are in particular not transferred to or via the outer casing of the camera body, that is in particular not to or via the separate cover elements.

For example, the cover element or elements comprises or comprise a front cover having a central opening which surrounds the objective connection. In this respect, the front cover and the objective connection are preferably separate from one another such that no forces and bending torques are transmitted onto the front cover by the objective connection. The front cover thus serves substantially for the bounding of the camera body to the outside and for the closing of the interior space of the camera body with respect to the environment of the camera, but substantially not for a carrying or supporting of the objective connection or of an interchangeable objective connected thereto.

The named fastening devices can, for example, be further prolongations like the previously described prolongations for the arrangement of the cover elements at the carrier structure. In this respect, the objective connection can either be fastened directly to these fastening devices or indirectly via a connection structure which can in particular serve to distribute forces and bending torques acting on the objective connection particularly favorably over the named fastening devices of the carrier structure. To this extent, this additional connection structure can supplement the carrier structure with respect to the functionality of a supporting structure or skeleton for the camera body otherwise predominantly taken over by the carrier structure, with the connection structure, however, unlike the carrier structure, not having any additional cooling function. The connection structure is rather preferably substantially thermally decoupled from the carrier structure since as little heat as possible is to be transferred from the carrier structure to the connection structure. This optional thermal decoupling can, as described with respect to the prolongations for the cover elements, take place by the type of prolongations or by an additional thermal insulation.

Furthermore, the named connection structure cannot only serve for the indirect fastening of the objective connection to the carrier structure, but can preferably simultaneously hold an image sensor of the video camera. It can, for example, be fastened to the connection structure and can be thermally conductively coupled at the rear side directly or indirectly to a front wall of the cooling passage, as will be explained in the following.

In accordance with a further advantageous embodiment, the cover element or elements comprises or comprise a front cover having a central opening, wherein the cooling passage is bounded in the direction of the passage axis toward the front cover by a front wall, and wherein the camera body accommodates an image sensor which is arranged between the front cover and the front wall and which is thermally conductively coupled to the front wall of the cooling passage. In this embodiment, a space is thus defined between the front wall of the cooling passage and the front cover of the camera body in which space the image sensor of the video camera is arranged. In this respect, an objective or an objective connection for an objective can be provided in or at the central opening of the front cover and radiation can penetrate through it into the camera body and can impact the image sensor.

In operation, the image sensor, which can in particular also comprise image sensor electronics for controlling and carrying out the image sensor function, can heat up. This heat can advantageously be transferred fast and reliably to the ventilation space in the interior of the cooling passage by the thermally conductive coupling of the image sensor to the front wall of the cooling passage so that the heat can be output and led off from the front wall of the cooling passage to the ventilation space. The thermally conductive coupling between the image sensor and the front wall can in this respect be formed directly or indirectly via a thermal conduction device. In addition, the image sensor can be connected to the carrier structure in two ways. On the one hand, the image sensor can be mechanically coupled to the carrier structure for a stable and precise alignment and can be thermally conductively coupled to the carrier structure for an efficient cooling, on the other hand, with the two couplings being able to be effected in different manners. For example, the mechanical coupling can take place indirectly via the above-named connection structure which is connected to the carrier structure via fastening devices, whereas a rear side of the image sensor can be thermally conductively connected to the named front wall via a thermal conduction device.

BRIEF DESCRIPTION OF THE DRAWINGS

The invention will be explained only by way of example in the following with reference to the drawings.

FIG. 3 shows the embodiment of the electronic video camera shown in FIG. 1 in a view corresponding to FIG. 1 with a side cover moved into a servicing position.

DETAILED DESCRIPTION OF THE PREFERRED EMBODIMENTS

Figure 1:
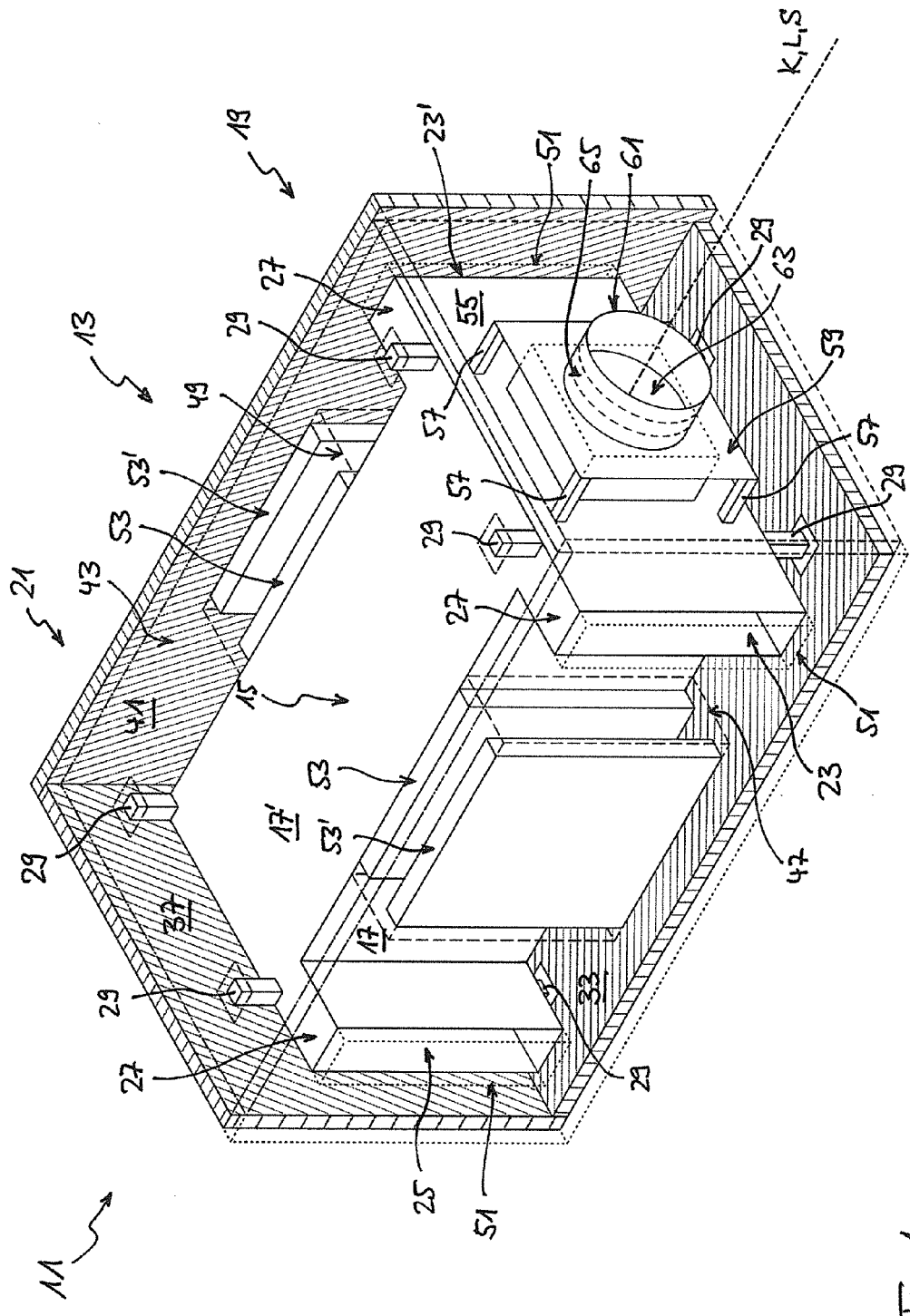
FIG. 1 shows a schematic perspective view of an embodiment of the electronic video camera.

An embodiment of the electronic video camera 11 is shown in the Figures which has a parallelepiped camera body 13. The camera body 13 is shown partly transparent in FIGS. 1 and 2 so that a carrier structure 15 can be recognized in the interior of the camera body 13. The camera body 13 and the carrier structure 15 are substantially elongate and extend along a longitudinal axis L of the camera body 13 or of a passage axis K of the carrier structure 15. In this respect, the carrier structure 15 has a substantially rectangular cross-section with respect to the passage axis K, with the four sides of the rectangular cross-section being formed by four side walls 17, 17' of the carrier structure 15. To this extent the carrier structure 15 extends in tubular form from a front section 19 to a rear section 21 of the camera body 13.

The carrier structure 15 is configured as a separate assembly which is produced independently of further components of the camera body 13 and has an independent, self-supporting multipart structure. In this respect, the carrier structure 15 has a frame of carbon fiber material, wall elements of copper and seal elements produced as injection molded parts from elastomer which are not each shown separately in the Figures.

In the front section 19 of the camera body 13, the carrier structure 15 has two inlet openings 23, 23' which are aligned opposite to one another transversely to the passage axis K and are aligned with respect to a right or a left side of the camera body 13 respectively. In the rear section 21 of the camera body 13, the carrier structure 15 has an outlet opening 25 which is aligned toward the right side of the camera body 13. The inlet openings 23, 23' and the outlet opening 25 form the ends of respective passage prolongations 27 which are aligned perpendicular to the longitudinal extent of the carrier structure 15 (i.e. perpendicular to the passage axis K) and which connect the carrier structure 15 extending centrally in the camera body 13 to respective sides of the camera body 13.

At an upper side wall 17' of the carrier structure 15, the carrier structure has a total of four prolongations 29 in respective corner regions, said four prolongations projecting upwardly from the upper side wall 17. Four corresponding prolongations 29 extend downwardly from the lower side wall (not shown) of the carrier structure 15. An upper cover 31 and a lower cover 33 are fastened to the carrier structure 15 via these prolongations 29. In this respect, the upper cover 31 is transparent with chain-dotted edges in FIG. 1 and is not shown in FIG. 2 so that the carrier structure 15 can be recognized through the upper cover 31. The lower cover 33 is shown hatched.

Further cover elements 35, 37, 39 and 41 are fastened to the upper cover 31 and to the lower cover 33; they are a front cover 35 (shown transparent with dashed edges in FIG. 1), a rear cover 37 (shown hatched), a first side cover 39 (shown transparent with dotted edges in FIG. 1) and a second side cover 41 (shown hatched). In this respect, the front cover 35 and the rear cover 37 are screwed to the upper cover 31 and to the lower cover 33 by means of screws, not shown, while the first and second side covers 39, 41 are screwed to the upper cover 31, to the lower cover 33, to the front cover 35 and to the rear cover 37 by means of screws, not shown. The cover elements 31, 33, 35, 37, 39, 41 surround an interior space 43 of the camera body 13 and thus bound the camera body 13 to the outside.

The interior space 43 of the camera body 13 is divided by the carrier structure 15, with the region forming a ventilation space 45 in the interior of the carrier structure 15. The ventilation space 45 can in particular be recognized in FIG. 2 since in FIG. 2 the upper side wall 17' of the carrier structure 15 is not shown. The remaining portion of the interior space 43 outside the carrier structure 15 can be understood as a whole as a component space. In the embodiment shown, this remaining part of the interior space 43, however, comprises a first component space 47 as well as a second component space 49, the components being shown only schematically dashed in the Figures and being delimited with respect to the remaining region of the interior space 43 outside the carrier structure 15 by wall elements, not shown.

The component spaces 47, 49 and the remaining region of the interior space 43 outside the carrier structure 15 are hermetically closed with respect to the ventilation space 45 and the environment of the camera 11 by the carrier structure 15 and the cover elements 31, 33, 35, 37, 39, 41. For this purpose, seals, not shown, can in particular be provided between the carrier structure 15 and the first side cover 39 or the second side cover 41 at the inlet openings 23, 23' and at the outlet opening 25. In contrast, the first and second component spaces 47, 49 are substantially only structurally closed, but not sealingly in equal measure, relative to one another and to the remaining region of the interior space 43 outside the carrier structure 15.

Two passage openings 51 are provided in the first side cover 39 and one passage opening 51 (shown dashed) is provided in the second side cover 41 flush with the inlet openings 23, 23 and the outlet opening 25 of the carrier structure 15 so that the ventilation space 45 is open toward the environment of the video camera 11. In particular air can thus flow into and out of the ventilation space 45 respectively through the inlet openings 23, 23' and the outlet opening 25. The carrier structure 15 to this extent forms a cooling passage for the camera body 13.

The first and second component spaces 47, 49 directly border the right side wall 17 or the left side wall respectively of the cooling passage 15. Both component spaces 47, 49 accommodate respective electronic components 53, 53', with some of the electronic components 53 (shown as a uniform block in the Figures) being arranged next to one another and areally contacting the respective side wall 17 of the cooling passage 15 via a thermal conduction layer, not shown, and thus being thermally conductively coupled to the cooling passage 15, whereas other electronic components 53' (likewise shown as a uniform block) are fastened to the first side cover 39 or to the second side cover 41.

In the front section 19 of the camera body 13, the cooling passage 15 is bounded toward the front cover 35 by a front wall 55. Similarly to the upper side wall 17' and to the lower side wall of the carrier structure 15, the front wall 55 has prolongations 57 which serve as fastening devices for fastening a connection structure 59 to the carrier structure 15. An objective connection 61, on the one hand, and an image sensor 63 of the video camera 11, on the other hand, are fastened to the connection structure 59. To this extent, the connection structure 59 forms a supporting structure of the camera body 13 together with the carrier structure 15. The carrier structure 15 and the connection structure 59 could also form a single, common structure or assembly for this purpose which could optionally also comprise the objective connection 61.

The space between the connection structure 59 and the front wall 55 of the cooling passage 15 can be understood as a further component space and can be delimited with respect to the remaining inner space 43 of the camera body 13 by wall elements, not shown. The image sensor 63 is consequently arranged in this component space, with a rear side of the image sensor 63 areally contacting the front wall 55 of the cooling passage 15 via a thermal conduction layer and in this manner thermally conductively coupling the image sensor 63 to the cooling passage 15. Heat emanating from the image sensor 63 can thus be transferred fast to the cooling passage 15 and can be output by the cooling passage 15 to the ventilation space 45. In this manner, the image sensor 63 can be operated at a substantially ideal operating temperature.

The objective connection 61 fastened like the image sensor 63 to the connection structure 59 projects out of the camera body 13 through an opening 65 in the front cover 35. In this respect, the objective connection 61 can, for instance, be closed at or behind the objective connection 61 by a closure, not shown, or by a radiation-permeable disc, not shown (e.g. an optical filter) so that, with the exception of the ventilation space 45, the interior space 43 is also sealingly closed with respect to the environment of the camera 11 when, as shown, no interchangeable objective is connected to the objective connection 61.

A visual axis S of the camera 11 is furthermore defined by the objective connection 61 and stands substantially perpendicular on the center point of the opening 65. Which side of the camera body 13 forms a left side, a right side, an upper side, a lower side, a front side or a rear side can in particular be defined with respect to this visual axis S. In the embodiment shown, the visual axis S coincides with the longitudinal axis L of the camera body 13 and with the passage axis K of the carrier structure 15 forming the cooling passage. The elongate camera body 13 and the cooling passage 15 extending centrally therein and likewise being elongate thus extend substantially in parallel with one another in the direction of the visual axis S, that is in the direction from the front to the back.

Figure 2:
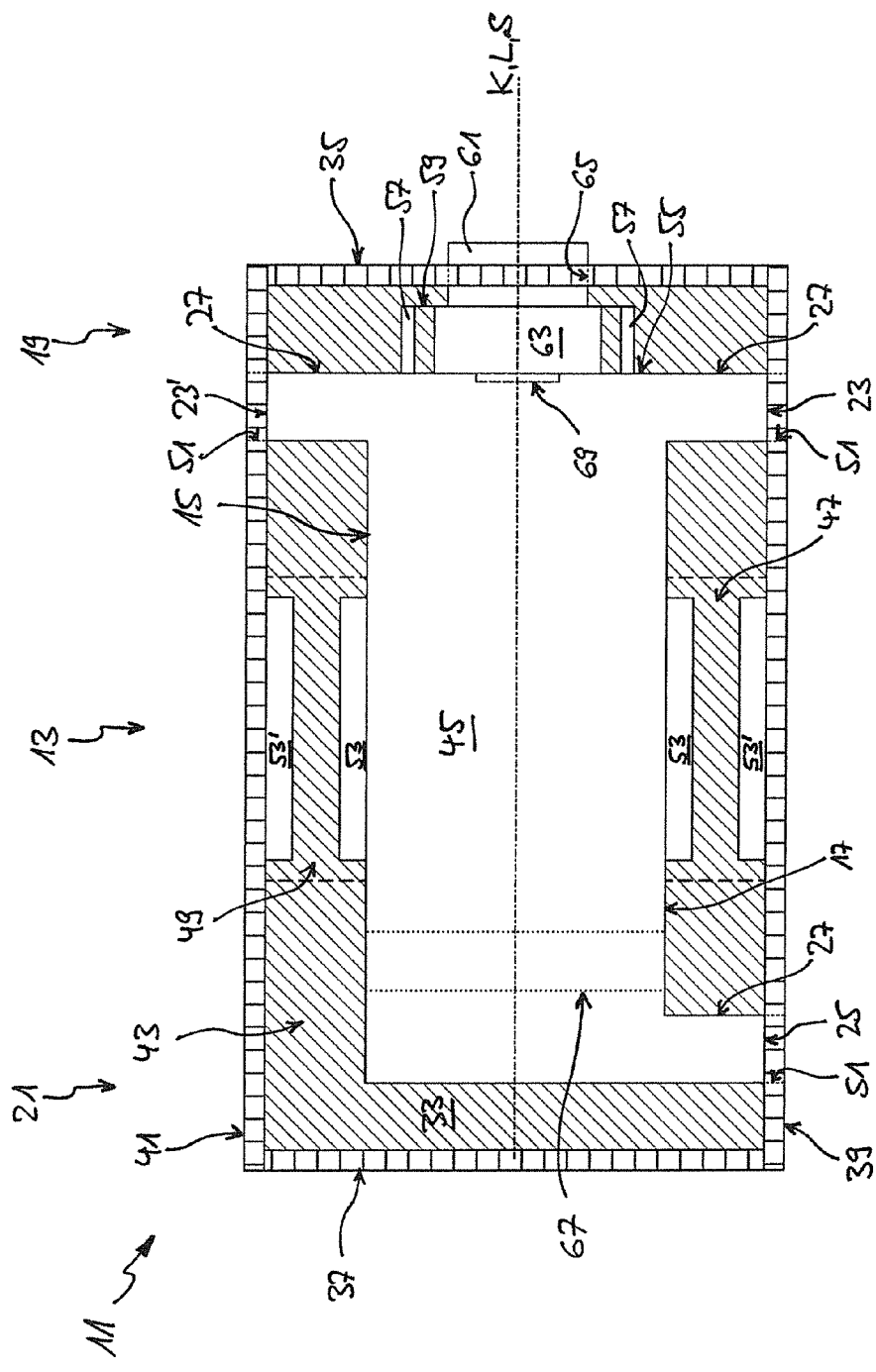
FIG. 2 shows the embodiment of the electronic video camera shown in FIG. 1 in a schematic view from above.

As is shown schematically in FIG. 2, a blower 67 (shown dotted) is arranged in the cooling passage 15 and an air flow through the cooling passage can be generated by it which extends along the passage axis K up to the outlet opening 25, starting from the inlet openings 23, 23', through the total longitudinal extent of the cooling passage. Heat which is transferred from inner surfaces of the carrier structure 15 to the air in the ventilation space 45 is conveyed out of the cooling passage 15 by the air flow. Furthermore, new, cooler air is sucked into the cooling passage 15 from the environment of the video camera 11 by the air flow so that the new air can take up further heat and can convey it out of the camera body 13, etc. The heat transfer from the carrier structure 15 to the air in the ventilation space 45 is moreover improved in that the inner surface of the carrier structure 15 is enlarged by a multiple by cooling fins, not shown, which extend into the ventilation space 45 and are aligned in parallel with the passage axis K.

The amount of heat dissipation can be increased as required via the intensity of the blower 67. For this purpose, at least one temperature sensor 69 (shown dashed), for example a Peltier sensor, can be arranged in the ventilation space 45, for instance at an inner surface of the carrier structure 15 and in particular at an inner side of the front wall 55. The temperature sensor 69 can detect a temperature of the cooling passage 15 or of the ventilation space 45 so that the intensity of the blower 67 can be controlled in dependence on this temperature.

The same respective embodiment of the electronic video camera 11 is shown in different manners in the Figures. FIG. 3 differs from FIGS. 1 and 2 in particular to the extent that the first side cover 39 is shown released from the remaining camera body 13 in FIG. 3. To release the first side cover 39 from the remaining camera body, only the screw connections to cover elements 31, 33, 35, 37, at which the first side cover 39 is fastened, would have to be released. The first side cover 39 is pivoted substantially by 90° about its lower edge and is shown slightly spaced apart from the remaining camera body 13. To this extent, the first side cover 39 is completely removed from the camera body 13.

The first component space 47 in the interior space 43 of the camera body 13 is exposed by the release of the side cover 39. Access to the electronic components 53, 53' arranged in this component space 47 is thereby made possible. This is in particular necessary when at least one of the electronic components 53, 53' has to be contacted, repaired or replaced, for instance for servicing purposes or also for a conversion or for a retrofitting of the video camera.

The electronic components 53' of the first component space 47 arranged at the side cover 39 are released from the remaining camera body 13 together with the side cover 39 on the release of the first side cover 39 and are thus removed from the first component space 47. In this respect, however, they can still remain coupled in a different manner to the remaining camera body 13, in particular to other electronic components 53 in the interior space 43 of the camera body 13, for instance via cable connections (not shown).

As can in particular be recognized in FIG. 3, a plurality of different advantages, which are material to the invention, are achieved by the arrangement of the carrier structure 15 in the camera body 13 and by the arrangement of the cover elements 31, 33, 35, 37, 39, 41 at the carrier structure 15: The carrier structure 15 forms a stable basic structure for the camera body 13 so that the video camera 11 can be configured particularly ruggedly overall. The cover elements arranged directly at the carrier structure 15, i.e. the upper cover 31 and the lower cover 33, are held in a stable manner by the carrier structure 15 and thus moreover offer reliable connection possibilities for the fastening of accessory devices to the video camera 11.

At the same time, due its tubular form, the carrier structure 15 forms a cooling passage 15, which passes centrally through the camera body 13 along its longitudinal axis L, so that overall a particularly efficient dissipation of the heat takes place which emanates from electronic components 53, 53' of the video camera 11 arranged in the camera body 13. The type of the arrangement of the cover elements 31, 33, 35, 37, 39, 41 at the carrier structure 15, in particular the releasability of at least one of the cover elements 31, 33, 35, 37, 39, 41 from the remaining camera body 13, furthermore makes possible—for instance for servicing purposes—a simple direct access to the electronic components 53, 53' in the component spaces 47, 49 which are exposed by the release of a respective cover element 31, 33, 35, 37, 39, 41.

In particular since the ventilation space 45 extends centrally through the interior space 43 of the camera body 13, all possible component spaces 47, 49 lie in an outer jacket region around the cooling passage 15 or (with respect to the passage axis K) in front of or behind the cooling passage 15 so that all component spaces 47, 49 are ultimately separated from the environment of the camera 11 by a single cover element 31, 33, 35, 37, 39, 41 and can therefore be directly exposed in a simple manner. The video camera 11 thus has a high stability, a good cooling efficiency and a high servicing friendliness.

The invention claimed is:

1. An electronic video camera having a camera body which comprises an inner carrier structure and at least one outer cover element which is arranged at the carrier structure and which bounds an interior space of the camera body,
wherein the carrier structure includes a central cooling passage which extends at least sectionally along a passage axis and divides the interior space of the camera body into a ventilation space within the cooling passage and into at least one component space outside the cooling passage, with the ventilation space being open toward the environment of the video camera and with the component space being sealingly closed with respect to the ventilation space and to the environment of the video camera;
wherein the video camera has electronic components which are received in the component space and which are thermally conductively coupled to the ventilation space via at least one side wall of the cooling passage;
wherein the at least one cover element forms a side cover which is releasable to expose the electronic components arranged in the component space for servicing purposes; and
wherein the electronic components are arranged at the cooling passage at least two sides of the cooling passage aligned opposite to one another transversely to the passage axis.

2. The video camera in accordance with claim 1, wherein at least some of the electronic components are arranged along the side wall of the cooling passage.

3. The video camera in accordance with claim 1, wherein the side cover can be moved relative to the camera body into a servicing position; or wherein the side cover can be completely removed from the camera body.

4. The video camera in accordance with claim 1, wherein the camera body has an elongate shape along a longitudinal axis, with the passage axis coinciding with the longitudinal axis of the camera body or extending in parallel with the longitudinal axis of the camera body.

5. The video camera in accordance with claim 1, wherein the cooling passage extends between a front section of the camera body and a rear section of the camera body; and wherein the cooling passage has at least one net opening in the front section and at least one outlet opening in the rear section, or vice versa.

6. The video camera in accordance with claim 1, wherein the electronic components are coupled thermally conductively to the side wall of the cooling passage directly or via a thermal conduction device.

7. An electronic video camera having a camera body which comprises an inner carrier structure and at least one outer cover element which is arranged at the carrier structure and which bounds an interior space of the camera body,
wherein the carrier structure includes a central cooling passage which extends at least sectionally along a passage axis and divides the interior space of the camera body into a ventilation space within the cooling passage and into at least one component space outside the cooling passage, with the ventilation space being open toward the environment of the video camera and with the component space being sealingly closed with respect to the ventilation space and to the environment of the video camera;
wherein the video camera has electronic components which are received in the component space and which are thermally conductively coupled to the ventilation space via at least one side wall of the cooling passage;
wherein the at least one cover element forms a side cover which is releasable to expose the electronic components arranged in the component space for servicing purposes; and
wherein the camera body has an outer casing which comprises the at least one outer cover element, with the carrier structure forming an assembly separate from the outer casing.

8. The video camera in accordance with claim 7, wherein the assembly has a frame from a first material and wall elements from a second material held in the frame, with the second material having a higher thermal conductivity than the first material.

9. An electronic, video camera having a camera body which comprises an inner carrier structure and at least one outer cover element which is arranged at the carrier structure and which bounds an interior space of the camera body,
wherein the carrier structure includes a central cooling passage which extends at least sectionally along a passage axis and divides the interior space of the camera body into a ventilation space within the cooling passage and into at least one component space outside the cooling passage, with the ventilation space being open toward the environment of the video camera and with the component space being sealingly closed with respect to the ventilation space and to the environment of the video camera;
wherein the video camera has electronic components which are received in the component space and which are thermally conductively coupled to the ventilation space via at least one side wall of the cooling passage;
wherein the at least one cover element forms a side cover which is releasable to expose the electronic components arranged in the component space for servicing purposes; and
wherein the carrier structure has a plurality of prolongations for fastening the at least one cover element.

10. An electronic video camera having a camera body which comprises an inner carrier structure and at least one cuter cover element which is arranged at the carrier structure and which bounds an interior space of the camera body,
wherein the carrier structure includes a central cooling passage which extends at least sectionally along a passage axis and divides the interior space of the camera body into a ventilation space within the cooling passage and into at least one component space outside the cooling passage, with the ventilation space being open toward the environment of the video camera and with the component space being sealingly closed with respect to the ventilation space and to the environment of the video camera;
wherein the video camera has electronic components which are received in the component space and which are thermally conductively coupled to the ventilation space via at least one side wall of the cooling passage;
wherein the at least one cover element forms a side cover which is releasable to expose the electronic components arranged in the component space for servicing purposes; and
wherein the camera body comprises a plurality of outer cover elements which is arranged at the carrier structure and which surround the interior space of the camera body.

11. The video camera in accordance with claim 10, wherein the cover elements form at least one first group and one second group; and wherein only the cover elements of the first group are directly fastened to the carrier structure and the cover elements of the second group are indirectly fastened to the carrier structure via the cover elements of the first group.

12. The video camera in accordance with claim 10, wherein the cover elements comprise at least one front cover, one rear cover one upper cover one lower cover, one first side cover and one second side cover.

13. The video camera in accordance with claim 12, wherein only the upper cover and the lower cover are directly fastened to the carrier structure.

14. The video camera in accordance with claim 12, wherein the front cover and the rear cover are fastened to the upper cover and to the lower cover.

15. The video camera in accordance with claim 12, wherein the first side cover and the second side cover are fastened to the upper cover, to the lower cover, to the front cover and/or to the rear cover.

16. An electronic video camera having a camera body which comprises an inner carrier structure and at least one outer cover element which is arranged at the carrier structure and which bounds an interior space of the camera body,
wherein the carrier structure includes a central cooling passage which extends at least sectionally along a passage axis and divides the interior space of the camera body into a ventilation space within the cooling passage and into at least one component space outside the cooling passage, with the ventilation space being open toward the environment of the video camera and with the component space being sealingly closed with respect to the ventilation space and to the environment of the video camera;
wherein the video camera has electronic components which are received in the component space and which are thermally conductively coupled to the ventilation space via at least one side wall of the cooling passage;
wherein the at least one cover element forms a side cover which is releasable to expose the electronic components arranged in the component space for servicing purposes; and
wherein at least one first component space and one second component space are formed in the interior space of the camera body, in which components spaces electronic components are received, with the first component space being sealingly closed by a first side cover and the second component space being sealingly closed by a second side cover, and with the first side cover and the second side cover being movable or removable to expose the electronic components arranged in the respective component space for servicing purposes.

17. The video camera in accordance with claim 16, wherein the first component and the second component are arranged at two sides of the cooling passage opposite to one another transversely to the passage axis.

18. An electronic video camera having a camera body which comprises an inner carrier structure and at least one outer cover element which is arranged at the carrier structure and which bounds an interior space of the camera body,
wherein the carrier structure includes a central cooling passage which extends at least sectionally along a passage axis and divides the interior space of the camera body into a ventilation space within the cooling passage and into at least one component space outside the cooling passage, with the ventilation space being open toward the environment of the video camera and with the component space being sealingly closed with respect to the ventilation space and to the environment of the video camera; wherein the video camera has electronic components which are received in the component space and which are thermally conductively coupled to the ventilation space via at least one side wall of the cooling passage;
wherein the at least one cover element forms a side cover which is releasable to expose the electronic components arranged in the component space for servicing purposes; wherein the cooling passage extends between a front section of the camera body and a rear section of the camera body; and
wherein the cooling passage has at least one net opening in the front section and at least one outlet opening in the rear section, or vice versa; and
wherein the cooling passage has two lateral net openings in the front section and one lateral outlet opening in the rear section.

19. An electronic video camera having a camera body which comprises an inner carrier structure and at least one outer cover element which is arranged at the carrier structure and which bounds an interior space of the camera body,
wherein the carrier structure includes a central cooling passage which extends at least sectionally along a passage axis and divides the interior space of the camera body into a ventilation space within the cooling passage and into at least one component space outside the cooling passage, with the ventilation space being open toward the environment of the video camera and with the component space being sealingly closed with respect to the ventilation space and to the environment of the video camera;
wherein the video camera has electronic components which are received in the component space and which are thermally conductively coupled to the ventilation space via at least one side wall of the cooling passage;
wherein the at least one cover element forms a side cover which is releasable to expose the electronic components arranged in the component space for servicing purposes;
wherein the cooling passage extends between a front section of the camera body and a rear section of the camera body, and wherein the cooling passage has at least one inlet opening in the front section and at least one outlet opening in the rear section, or vice versa; and
wherein the cooling passage has at least two net openings which are aligned opposite to one another transversely to the passage axis, and/or wherein the cooling passage has at least two outlet openings which are aligned opposite to one another transversely to the passage axis.

20. An electronic video camera having a camera body which comprises an inner carrier structure and at least one outer cover element which is arranged at the carrier structure and which bounds an interior space of the camera body,
wherein the carrier structure includes a central cooling passage which extends at least sectionally along a passage axis and divides the interior space of the camera body into a ventilation space within the cooling passage and into at least one component space outside the cooling passage, with the ventilation space being open toward the environment of the video camera and with the component space being sealingly closed with respect to the ventilation space and to the environment of the video camera;
wherein the video camera has electronic components which are received in the component space and which are thermally conductively coupled to the ventilation space via at least one side wall of the cooling passage;
wherein the at least one cover element forms a side cover which is releasable to expose the electronic components arranged in the component space for servicing purposes;
wherein the cooling passage extends between a front section of the camera body and a rear section of the camera body, and wherein the cooling passage has at least one net opening in the front section and at least one outlet opening in the rear section, or vice versa; and
wherein the at least one cover element of the camera body has one or more passage openings for a fluid communication of the ventilation space with the environment of the video camera in the region of at least one of the net openings and outlet openings of the cooling passage.

21. An electronic video camera having a camera body which comprises an inner carrier structure and at least one outer cover element which is arranged at the carrier structure and which bounds an interior space of the camera body,
wherein the carrier structure includes a central cooling passage which extends at least sectionally along a passage axis and divides the interior space of the camera body into a ventilation space within the cooling passage and into at least one component space outside the cooling passage, with the ventilation space being open toward the environment of the video camera and with the component space being sealingly closed with respect to the ventilation space and to the environment of the video camera;
wherein the video camera has electronic components which are received in the component space and which are thermally conductively coupled to the ventilation space via at least one side wall of the cooling passage;
wherein the at least one cover element forms a side cover which is releasable to expose the electronic components arranged in the component space for servicing purposes; and
wherein the cooling passage has cooling fins at the inner side which extend into the ventilation space and which are aligned substantially in parallel with the extent of the cooling passage.

22. An electronic video camera having a camera body which comprises an inner carrier structure and at least one outer cover element which is arranged at the carrier structure and which bounds an interior space of the camera body, wherein the carrier structure includes a central cooling passage which extends at least sectionally along a passage axis and divides the interior space of the camera body into a ventilation space within the cooling passage and into at least one component space outside the cooling passage, with the ventilation space being open toward the environment of the video camera and with the component space being sealingly closed with respect to the ventilation space and to the environment of the video camera;

wherein the video camera has electronic components which are received in the component space and which are thermally conductively coupled to the ventilation space via at least one side wall of the cooling passage;

wherein the at least one cover element forms a side cover which is releasable to expose the electronic components arranged in the component space for servicing purposes; and wherein a blower for the generation of a fluid flow through the cooling passage is provided in the ventilation space.

23. An electronic video camera having a camera body which comprises an inner carrier structure and at least one outer cover element which is arranged at the carrier structure and which bounds an interior space of the camera body, wherein the carrier structure includes a central cooling passage which extends at least sectionally along a passage axis and divides the interior space of the camera body into a ventilation space within the cooling passage and into at least one component space outside the cooling passage, with the ventilation space being open toward the environment of the video camera and with the component space being sealingly closed with respect to the ventilation space and to the environment of the video camera;

wherein the video camera has electronic components which are received in the component space and which are thermally conductively coupled to the ventilation space via at least one side wall of the cooling passage;

wherein the at least one cover element forms a side cover which is releasable to expose the electronic components arranged in the component space for servicing purposes; and wherein the camera body furthermore has an objective connection for an interchangeable objective, with the objective connection being fastened to the carrier structure.

24. An electronic video camera having a camera body which comprises an inner carrier structure and at least one outer cover element which is arranged at the carrier structure and which bounds an interior space of the camera body, wherein the carrier structure includes a central cooling passage which extends at least sectionally along a passage axis and divides the interior space of the camera body into a ventilation space within the cooling passage and into at least one component space outside the cooling passage, with the ventilation space being open toward the environment of the video camera and with the component space being sealingly closed with respect to the ventilation space and to the environment of the video camera;

wherein the video camera has electronic components which are received in the component space and which are thermally conductively coupled to the ventilation space via at least one side wall of the cooling passage;

wherein the at least one cover element forms a side cover which is releasable to expose the electronic components arranged in the component space for servicing purposes; and wherein the at least one cover element comprises a front cover having a central opening, with the cooling passage being bounded by a front wall in the direction of the passage axis toward the front cover, and with the camera body accommodating an image sensor which is arranged between the front cover and the front wall and is thermally conductively coupled to the front wall of the cooling passage.

* * * * *